(12) United States Patent
Wang et al.

(10) Patent No.: US 7,872,409 B2
(45) Date of Patent: Jan. 18, 2011

(54) WHITE LIGHT LED

(75) Inventors: Chih-lin Wang, Hsin-Chu (TW);
Wu-sheng Chi, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 450 days.

(21) Appl. No.: 12/022,559

(22) Filed: Jan. 30, 2008

(65) Prior Publication Data

US 2009/0033204 A1 Feb. 5, 2009

(30) Foreign Application Priority Data

Aug. 3, 2007 (TW) ............................... 96128755 A

(51) Int. Cl.
*H05B 33/00* (2006.01)

(52) U.S. Cl. ...................... 313/498; 313/112

(58) Field of Classification Search ........................ None
See application file for complete search history.

(56) References Cited

U.S. PATENT DOCUMENTS

| 5,739,552 | A | 4/1998 | Kimura et al. |
| 5,813,752 | A | 9/1998 | Singer et al. |
| 5,898,185 | A | 4/1999 | Bojarczuk, Jr. et al. |
| 5,952,681 | A | 9/1999 | Chen |
| 5,966,393 | A | 10/1999 | Hide et al. |
| 6,163,038 | A | 12/2000 | Chen et al. |
| 7,045,375 | B1 | 5/2006 | Wu et al. |
| 7,213,940 | B1* | 5/2007 | Van De Ven et al. ........ 362/231 |
| 7,279,350 | B2 | 10/2007 | Wu et al. |
| 7,319,289 | B2* | 1/2008 | Suehiro et al. .............. 313/485 |
| 7,569,987 | B2* | 8/2009 | Naitou ........................ 313/503 |
| 2006/0249739 | A1 | 11/2006 | Wang |
| 2009/0001389 | A1* | 1/2009 | Wang et al. .................... 257/89 |
| 2010/0025652 | A1* | 2/2010 | Stauss ........................ 257/13 |

FOREIGN PATENT DOCUMENTS

| CN | 1773703 | 5/2006 |
| JP | 60201681 | 10/1985 |
| JP | 63299382 | 12/1988 |
| JP | 11135838 | 5/1999 |
| TW | I260799 | 8/2006 |

OTHER PUBLICATIONS

Light-emitting Devices Based on InGaN/GaN Nano-structures, Horng-Shyang Chen, Jul. 2006.

* cited by examiner

*Primary Examiner*—Ashok Patel
(74) *Attorney, Agent, or Firm*—Kirton & McConkie; Evan R. Witt

(57) ABSTRACT

A white light LED is disclosed. The white light LED includes a dual-wavelength chip and an optical thin film. The dual-wavelength chip generates a first wavelength light and a second wavelength light. The optical thin film is disposed above the dual-wavelength chip. The optical thin film can partially be a quantum well thin film. Therefore, the quantum well thin film can be excited by the first wavelength light and/or second wavelength light to generate a third wavelength light. The optical thin film further comprises a plurality of windows to let the first and second wavelength lights pass through. By predetermining a ratio of the quantum well thin film area and the window area that belong to the optical thin film, a lumen ratio of the first, the second, and the third wavelength lights can be adjusted to realize white lights of different color temperatures.

10 Claims, 4 Drawing Sheets

WHITE LIGHT LED

BACKGROUND OF THE INVENTION

1. Field of the Invention

The present invention generally relates to a white light LED (light emitting diode), and more particularly, to a white light LED with quantum well structures and manufacturing method thereof.

2. Description of Prior Art

White light LED will no doubt be replacing traditional light source, such as the incandescent lamp, for realizing the objective of saving energy. FIG. 4 depicts a variety of conventional white light LEDs. The conventional technologies regarding manufacturing white light LEDs can be categorized into several groups as follows:

1. Di-chromatic light source, as shown in 1, 2 and 3 of 4(*a*) in FIG. 4:

Example 1 of 4(*a*), using a blue light luminous element and a yellow light luminous element to generate the blue and yellow lights and mixing the lights to produce white light;

Example 2 of 4(*a*), using a blue light luminous element to excite the yellow phosphor to generate the blue and yellow lights and mixing the lights to produce white light; and Example 3 of 4(*a*), using a dual-wavelength chip of blue light and yellow light to generate the blue and yellow lights and mixing the lights to produce white light.

2. Tri-chromatic light source, as shown in 1, 2 and 3 of 4(*b*) in FIG. 4:

Example 1 of 4(*b*), using a red light luminous element, a blue light luminous element and a green light luminous element to generate the red, blue and green lights and mixing the lights to produce white light;

Example 2 of 4(*b*), using a red light luminous element and a blue light luminous element to excite the green phosphor to generate the red, blue and green lights and mixing the lights to produce white light; and Example 3 of 4(*b*), using a UV light to excite the red, blue and green phosphors to generate the red, blue and green lights and mixing the lights to produce white light.

3. Tetra-chromatic light source, as shown in 1, 2 and 3 of 4(*c*) in FIG. 4:

Example 1 of 4(*c*), using a red light luminous element, a blue light luminous element, a green light luminous element and a cyan light luminous element to generate the red, blue, green and cyan lights and mixing the lights to produce white light;

Example 2 of 4(*c*), using a red light luminous element, a blue light luminous element and a cyan light luminous element to excite the green phosphor to generate the red, blue, green and cyan lights and mixing the lights to produce white light; and Example 3 of 4(*c*), using a red light luminous element and a blue light luminous element to excite the green phosphor and cyan phosphor to generate the red, blue, green and cyan lights and mixing the lights to produce white light. Alternatively, using more of different light sources to mix thereof to produce white light also can be considered.

The method of the di-chromatic light source has advantages of simplicity, stability and high luminous efficiency but has the drawback of low color gamut. The example 3 of the tri-chromatic light source has advantages of stable white point and large color gamut but has drawbacks of light leakage and yellowing phenomenon. The example 1, 2 of the tri-chromatic light source, the methods of the tetra-chromatic light source and more light sources have advantages of large color gamut and tunable white point but has drawbacks of complex driving circuits, color shift due to temperature and aging.

SUMMARY OF THE INVENTION

An objective of the present invention is to provide a white light LED having wide color gamut, adjustable color temperature and characteristics of simple structure, and high luminous efficacy.

Briefly summarized, the LED of the present invention comprises a dual-wavelength chip and an optical thin film. The dual-wavelength chip generates a first wavelength light and a second wavelength light. The optical thin film is disposed above the dual-wavelength chip and for receiving at least one of the first wavelength light and the second wavelength light so as to generate a third wavelength light. The optical thin film comprises quantum well structures and a plurality of windows. Predetermining a square measure proportion of the windows to the quantum well structures can adjust a lumen ratio of the first wavelength light, the second wavelength light and the third wavelength light to mix thereof to produce white light of different color temperatures. The first wavelength light of the present invention can be blue light. The second wavelength light can be green light and the third wavelength light generated by exciting the quantum well structures can be red light. The lumen ratio of the first wavelength light, the second wavelength light, and the third wavelength light satisfies the equation below:

the first wavelength light:the second wavelength light: the third wavelength light=1:1:y:x; and $y \cong 1.67x + 4.8$ For accomplishing the above objective, the present invention also provides a manufacturing method of a white light LED. The manufacturing method comprises the steps of: providing a dual-wavelength chip for generating a first wavelength light and a second wavelength light; and disposing an optical thin film above the dual-wavelength chip for receiving at least one of the first wavelength light or the second wavelength light so as to generate a third wavelength light, wherein the first wavelength light, the second wavelength light and the third wavelength light are mixed to produce white light.

DETAILED DESCRIPTION OF THE INVENTION

Figure 1:
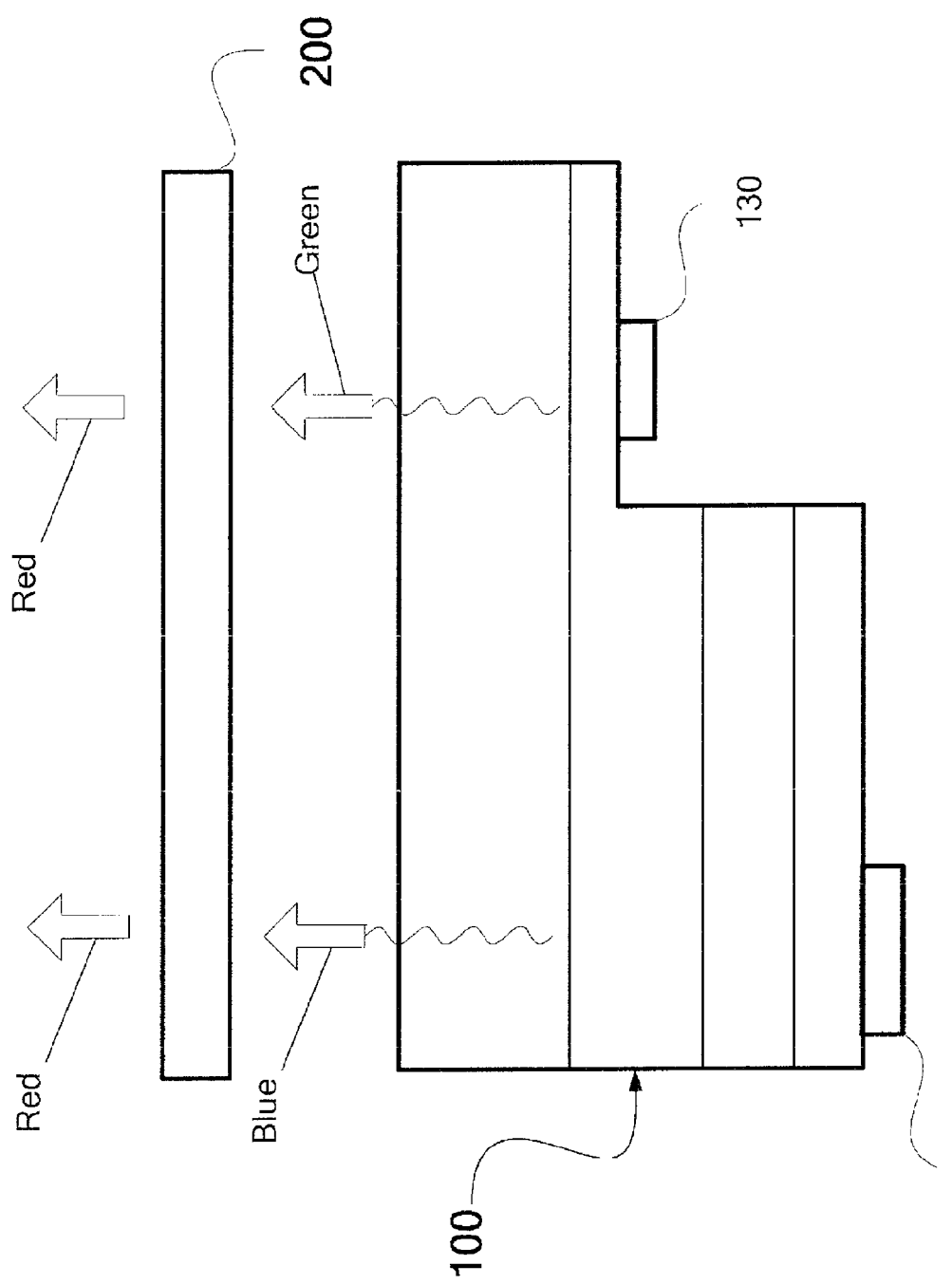
FIG. 1 depicts a diagram of generating white light by a white light LED according to a first embodiment of the present invention.

FIG. 1 depicts a diagram of generating white light by a white light LED according to a first embodiment of the present invention. The white light LED of the present invention comprises a dual-wavelength chip 100 and an optical thin film 200. The dual-wavelength chip 100 includes a first electrode 110 and a second electrode 130. The first electrode 110 and the second electrode 130 generate a first wavelength light and a second wavelength light by excitation. In this embodiment, the dual-wavelength chip can be a blue light and green light dual-wavelength chip. The generated first wavelength light can be blue light and the generated second wavelength light can be green light. The optical thin film 200 can be a partial red quantum well thin film disposed above the dual-wavelength chip 100.

The optical thin film 200 further includes a plurality of windows to let the first wavelength light and the second wavelength light pass through. The red quantum well structures of the optical thin film 200 receive the first wavelength light or the second wavelength light and are excited to generate the third wavelength light, i.e. the red light. According to the present invention, a square measure proportion of the windows to the quantum well structures of the optical thin film 200 can be predetermined to adjust a lumen ratio of the first wavelength light, the second wavelength light and the third wavelength light, accordingly, it is possible to mix the first wavelength light, the second wavelength light and the third wavelength light with different lumen ratios to produce different white light of different color temperatures. The aforesaid lumen ratio of the three lights can be adjusted according to production demands in advance before making the optical thin film 200. According to the experiences of inventors' research, the lumen ratio of the first wavelength light, the second wavelength light and the third wavelength light preferably satisfies the equation below:

the first wavelength light:the second wavelength light:
the third wavelength light=1:1:y:x; and $y=1.67x+4.8$ Moreover, the range of the first wavelength light is preferably between 450 nm to 460 nm. The range of the second wavelength light is preferably between 520 nm to 540 nm. The range of the first wavelength light is preferably between 620 nm to 630 nm.

Figure 2:
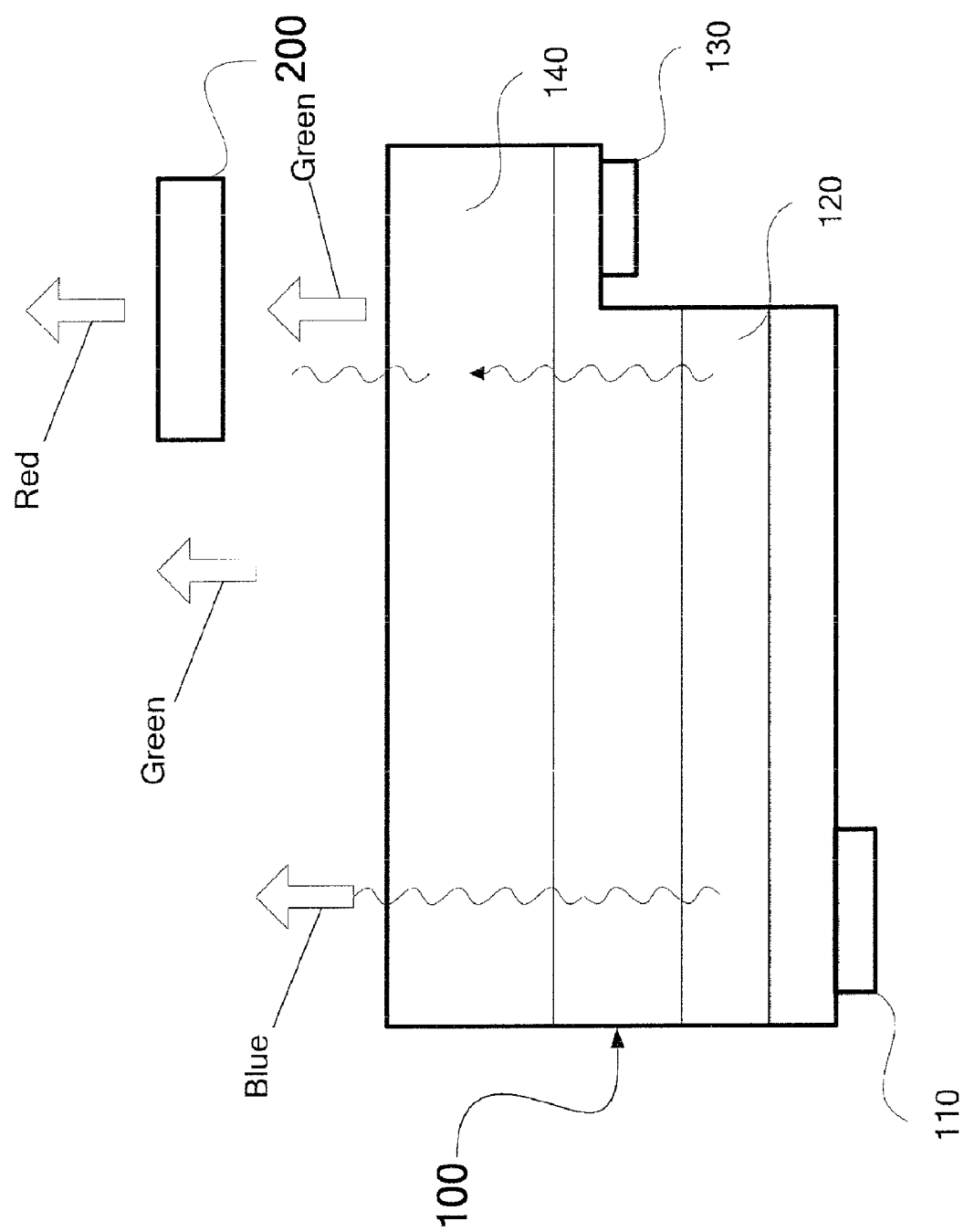
FIG. 2 depicts a diagram of generating white light by a white light LED according to a second embodiment of the present invention.

FIG. 2 depicts a diagram of generating white light by a white light LED according to a second embodiment of the present invention. The white light LED of the present invention comprises a dual-wavelength chip 100 and an optical thin film 200. A first electrode 110 of the dual-wavelength chip 100 generates a first wavelength light in a first area above the first electrode 110 through the first exciting layer 120. A second electrode 130 of the dual-wavelength chip 100 generates a second wavelength light in a second area above the second electrode 130 through the second exciting layer 140. In this embodiment, the dual-wavelength chip can be a blue light and green light dual-wavelength chip. The generated first wavelength light can be blue light and the generated second wavelength light can be green light. The optical thin film 200 can be a partial red quantum well thin film, disposed above the second electrode 130. The area of disposing the optical thin film 200 at least covers the second area.

Figure 3:
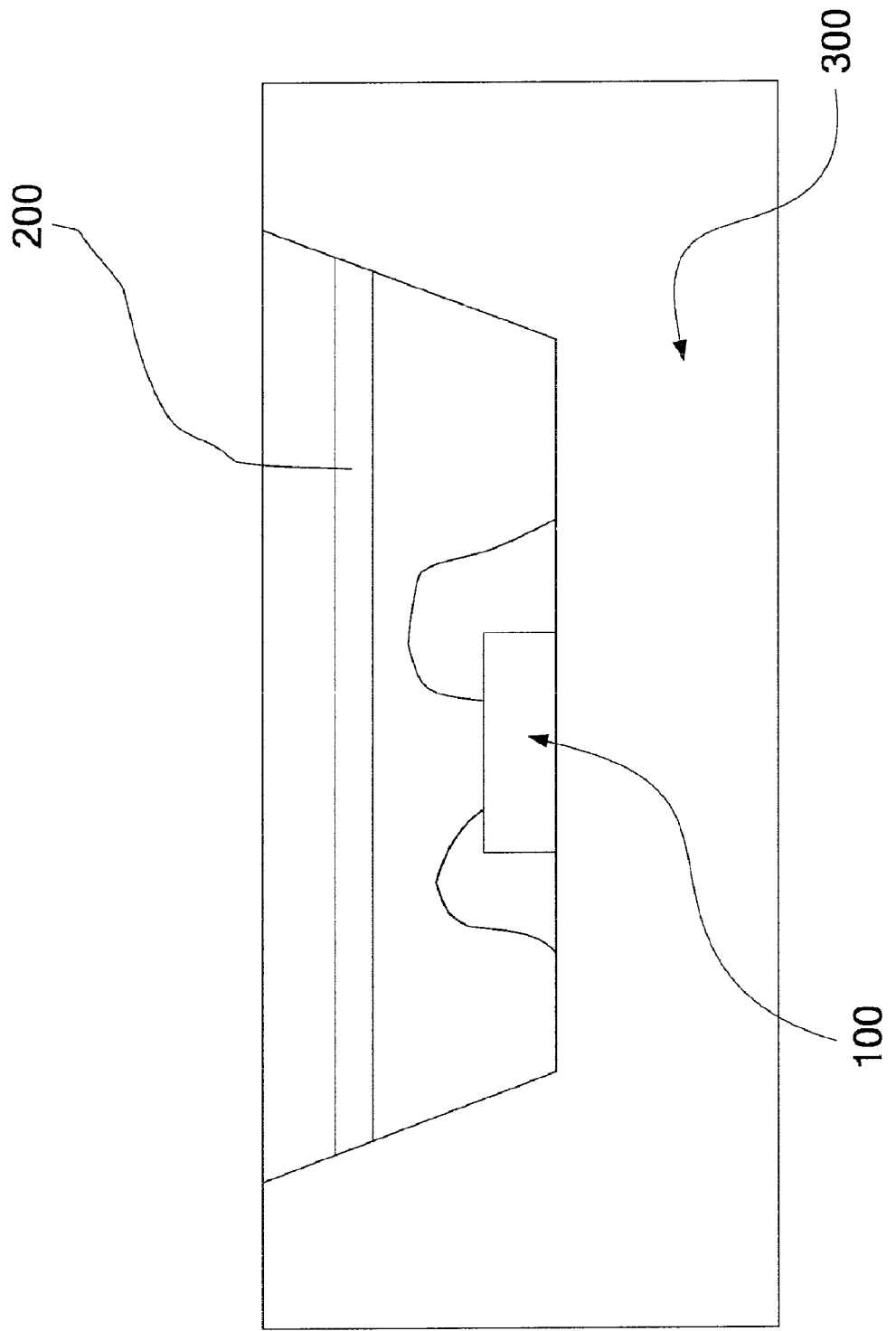
FIG. 3 depicts a diagram of packaging for a dual-wavelength chip and an optical thin film of a white light LED according to the present invention.
Figure 4:
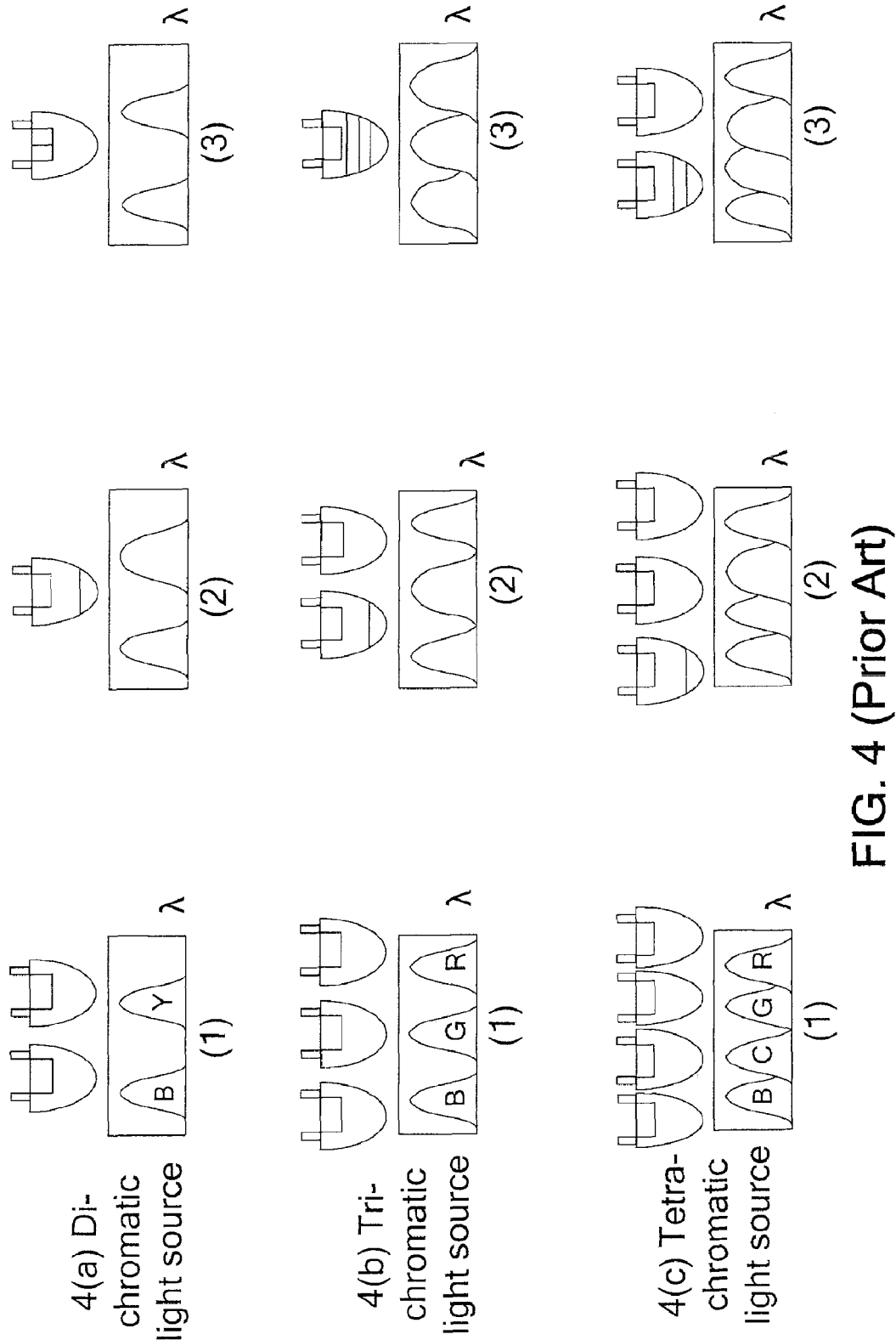
FIG. 4 depicts a variety of conventional white light LEDs.

The optical thin film 200 further includes a plurality of windows to let the second wavelength light pass through. The red quantum well structures of the optical thin film 200 receive the second wavelength light and are excited to generate the third wavelength light, i.e. the red light. Furthermore, according to the present invention, an occupied area proportion of the windows of the optical thin film 200 to the quantum well structures thereof can be predetermined for adjusting a lumen ratio of the first, the second and the third wavelength lights. Therefore, it is possible to adjust aforesaid lumen ratio to mix three lights to produce different white light of different color temperatures according to production demands in advance before making the optical thin film 200. According to the experiences of inventors' research and development, the lumen ratio of the first wavelength light, the second wavelength light and the third wavelength light preferably satisfies the equation below:

the first wavelength light:the second wavelength light:
the third wavelength light=1:1:y:x; and $y=1.67x+4.8$ FIG. 3 depicts a diagram of packaging a dual-wavelength chip 100 and an optical thin film 200 of a white light LED according to the present invention. When packaging the white light LED of the present invention, a package component 300 is the only necessary device to package the dual-wavelength chip 100, and then disposing the optical thin film 200 above the dual-wavelength chip 100, and then the packaging of the white light LED is finished. Moreover, occupied areas of aforesaid quantum well structures and windows of the optical thin film 200 are predetermined before the package of making the optical thin film 200. Therefore, the white light LED of the present invention not only has advantages of the di-chromatic light source which has simplicity, easy driving circuits and high luminous efficiency but also has advantages of the tri-chromatic light source which has large color gamut and tunable white point.

The light emitting diode of the invention is configured to use in a backlight module (not shown) for use in a liquid crystal display (not shown).

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structures.

What is claimed is:

1. A light emitting diode, comprising:
a dual-wavelength chip for generating a first wavelength light and a second wavelength light; and
an optical thin film, disposed above the dual-wavelength chip, for receiving at least one of the first wavelength light and the second wavelength light so as to generate a third wavelength light to mix with the first wavelength light, the second wavelength light, and the third wavelength light to produce a monochromatic light,
wherein the optical thin film comprises quantum well structures and a plurality of windows to let the first and second wavelength lights pass through and a lumen ratio of the first wavelength light, the second wavelength light and the third wavelength light is adjusted by predetermining a square measure proportion of the windows to the quantum well structures,
wherein the lumen ratio satisfies the following equation:

the first wavelength light:the second wavelength light:
the third wavelength light=1:y:x; and $y \approx 1.67x+4.8$.

2. The light emitting diode according to claim 1, wherein the first wavelength light is a blue light having a wavelength of 450 nm to 460 nm.

3. The light emitting diode according to claim 1, wherein the second wavelength light is a green light having a wavelength of 520 nm to 540 nm.

4. The light emitting diode according to claim 1, wherein the third wavelength light is a red light having a wavelength of 620 nm to 630 nm.

5. The light emitting diode according to claim 1, wherein the monochromatic light is a white light.

6. The light emitting diode according to claim 5, wherein a lumen ratio of the first wavelength light, the second wavelength light, and the third wavelength light is adjustable to realize the white light of different color temperatures.

7. A backlight module for use in a liquid crystal display, comprising the light emitting diode of claim 1.

8. A method of manufacturing a light emitting diode, comprising:

providing a dual-wavelength chip for generating a first wavelength light and a second wavelength light; and disposing an optical thin film above the dual-wavelength chip for receiving at least one of the first wavelength light and the second wavelength light so as to generate a third wavelength light, wherein the first wavelength light, the second wavelength light, and the third wavelength light are mixed to produce a monochromatic light, wherein the optical thin film comprises quantum well structures and a plurality of windows to let the first and second wavelength lights pass through and a lumen ratio of the first wavelength light, the second wavelength light and the third wavelength light is adjusted by predetermining a square measure proportion of the windows to the quantum well structures, wherein the lumen ratio satisfies the following equation:

the first wavelength light:the second wavelength light: the third wavelength light=1:y:x; and $y \approx 1.67x+4.8$.

9. The method according to claim 8, wherein the monochromatic light is a white light.

10. The method according to claim 9, further comprising adjusting a lumen ratio of the first wavelength light, the second wavelength light and the third wavelength light so as to realize the white light of different color temperatures.

* * * * *